(12) United States Patent
Cunningham et al.

(10) Patent No.: US 8,420,427 B2
(45) Date of Patent: Apr. 16, 2013

(54) METHODS FOR IMPLEMENTATION OF A SWITCHING FUNCTION IN A MICROSCALE DEVICE AND FOR FABRICATION OF A MICROSCALE SWITCH

(75) Inventors: Shawn Jay Cunningham, Irvine, CA (US); Dana Richard DeReus, Irvine, CA (US); Subham Sett, Lincoln, RI (US); John Gilbert, Brookline, MA (US)

(73) Assignee: Wispry, Inc., Irvine, CA (US)

( * ) Notice: Subject to any disclaimer, the term of this patent is extended or adjusted under 35 U.S.C. 154(b) by 0 days.

(21) Appl. No.: 11/492,671

(22) Filed: Jul. 25, 2006

(65) Prior Publication Data
US 2007/0158775 A1    Jul. 12, 2007

Related U.S. Application Data

(62) Division of application No. 10/291,125, filed on Nov. 8, 2002.

(60) Provisional application No. 60/337,527, filed on Nov. 9, 2001, provisional application No. 60/337,528, filed on Nov. 9, 2001, provisional application No. 60/337,529, filed on Nov. 9, 2001, provisional application No. 60/338, 055, filed on Nov. 9, 2001, provisional application No. 60/338,069, filed on Nov. 9, 2001, provisional application No. 60/338,072, filed on Nov. 9, 2001.

(51) Int. Cl.
*H01L 21/00* (2006.01)

(52) U.S. Cl.
USPC .................. 438/48; 438/510; 257/E27.112

(58) Field of Classification Search .................. 438/48, 438/510; 257/467, E27.112; 337/107, 109; 333/262
See application file for complete search history.

(56) References Cited

U.S. PATENT DOCUMENTS 4,423,401 A * 12/1983 Mueller ......................... 337/107
5,367,429 A * 11/1994 Tsuchitani et al. ............ 361/280

(Continued)

FOREIGN PATENT DOCUMENTS

WO    WO 03/043042    5/2003

OTHER PUBLICATIONS

Office Action-Restriction/Election Requirement dated May 4, 2004 for U.S. Appl. No. 10/291,125.

(Continued)

*Primary Examiner* — Charles Garber
*Assistant Examiner* — Abdulfattah Mustapha
(74) *Attorney, Agent, or Firm* — Jenkins, Wilson, Taylor & Hunt, P.A.

(57) ABSTRACT

Methods for Implementation of a Switching Function in a Microscale Device and for Fabrication of a Microscale Switch. According to one embodiment, a method is provided for implementing a switching function in a microscale device. The method can include providing a stationary electrode and a stationary contact formed on a substrate. Further, a movable microcomponent suspended above the substrate can be provided. A voltage can be applied between the between a movable electrode of the microcomponent and the stationary electrode to electrostatically couple the movable electrode with the stationary electrode, whereby the movable component is deflected toward the substrate and a movable contact moves into contact with the stationary contact to permit an electrical signal to pass through the movable and stationary contacts. A current can be applied through the first electrothermal component to produce heating for generating force for moving the microcomponent.

12 Claims, 7 Drawing Sheets

U.S. PATENT DOCUMENTS

| | | | |
|---|---|---|---|
| 5,376,772 A | | 12/1994 | Nakagawa et al. |
| 5,619,177 A | * | 4/1997 | Johnson et al. ............... 337/140 |
| 5,870,007 A | * | 2/1999 | Carr et al. ..................... 333/262 |
| 6,236,300 B1 | | 5/2001 | Minners |
| 6,275,325 B1 | * | 8/2001 | Sinclair ......................... 359/291 |
| 6,708,491 B1 | | 3/2004 | Weaver et al. |
| 6,882,264 B2 | | 4/2005 | Cunningham et al. |

OTHER PUBLICATIONS

Office Action-Non final action dated Dec. 2, 2004 for U.S. Appl. No. 10/291,125.

Office Action-Non final action dated Aug. 10, 2005 for U.S. Appl. No. 10/291,125.

Office Communication dated Jun. 2, 2006 for U.S. Appl. No. 10/291,125.

Office Action- final action dated Jun. 14, 2007 for U.S. Appl. No. 10/291,125.

Office Action-Restriction/Election Requirement dated Jan. 7, 2009 for U.S. Appl. No. 10/291,125.

Office Action-Non-Final dated Oct. 20, 2009 for U.S. Appl. No. 10/291,125.

International Search Report and Written Opinion for PCT/US02/35923 dated Mar. 11, 2003.

Official Action Non-Final dated Oct. 23, 2006 for U.S. Appl. No. 10/291,125.

Advisory Action dated Jan. 10, 2008 for U.S. Appl. No. 10/291,125.

Interview Summary corresponding to U.S. Appl. No. 10/291,125 dated Jul. 10, 2009.

Interview Summary corresponding to U.S. Appl. No. 10/291,125 dated Jun. 22, 2010.

Notice of Allowance dated Sep. 17, 2010 for U.S. Appl. No. 10/291,125.

Final Office Action dated May 25, 2011 for U.S. Appl. No. 10/291,125.

Non-Final Office Action dated Dec. 14, 2010 for U.S. Appl. No. 10/291,125.

\* cited by examiner

METHODS FOR IMPLEMENTATION OF A SWITCHING FUNCTION IN A MICROSCALE DEVICE AND FOR FABRICATION OF A MICROSCALE SWITCH

RELATED APPLICATIONS

This application is a divisional patent application from and which claims the benefit of the filing date of U.S. patent application Ser. No. 10/291,125, filed Nov. 8, 2002, which claims the benefit of U.S. Provisional Application No. 60/337,527, filed Nov. 9, 2001; U.S. Provisional Application No. 60/337,528, filed Nov. 9, 2001; U.S. Provisional Application No. 60/337,529, filed Nov. 9, 2001; U.S. Provisional Application No. 60/338,055, filed Nov. 9, 2001; U.S. Provisional Application No. 60/338,069, filed Nov. 9, 2001; U.S. Provisional Application No. 60/338,072, filed Nov. 9, 2001, the disclosures of which are incorporated by reference herein in their entirety. Additionally, the disclosures of the following U.S. Patent Applications commonly assigned and simultaneously filed with U.S. patent application Ser. No. 10/291,125, are all incorporated by reference herein in their entirety: U.S. Pat. No. 6,876,047 (application Ser. No. 10/290,779), filed Nov. 8, 2002; U.S. Pat. No. 6,746,891 (application Ser. No. 10/290,920), filed Nov. 8, 2002; U.S. Pat. No. 6,876,482 (application Ser. No. 10/291,107), filed Nov. 8, 2002; and U.S. Pat. No. 6,882,264 (application Ser. No. 10/290,807), filed Nov. 8, 2002.

TECHNICAL FIELD

The present invention generally relates to micro-electromechanical systems (MEMS) devices and methods. More particularly, the present invention relates to the design and fabrication of movable MEMS microscale structures.

BACKGROUND ART

An electrostatic MEMS switch is a switch operated by an electrostatic charge and manufactured using MEMS techniques. A MEMS switch can control electrical, mechanical, or optical signal flow. MEMS switches have typical application to telecommunications, such as DSL switch matrices and cell phones, Automated Testing Equipment (ATE), and other systems that require low cost switches or low-cost, high-density arrays.

As can be appreciated by persons skilled in the art, many types of MEMS switches and related devices can be fabricated by either bulk or surface micromachining techniques. Bulk micromachining generally involves sculpting one or more sides of a substrate to form desired three-dimensional structures and devices in the same substrate material. The substrate is composed of a material that is readily available in bulk form, and thus ordinarily is silicon or glass. Wet and/or dry etching techniques are employed in association with etch masks and etch stops to form the microstructures. Etching is typically performed through the backside of the substrate. The etching technique can generally be either isotropic or anisotropic in nature. Isotropic etching is insensitive to the crystal orientation of the planes of the material being etched (e.g., the etching of silicon by using a nitric acid as the etchant). Anisotropic etchants, such as potassium hydroxide (KOH), tetramethyl ammonium hydroxide (TMAH), and ethylenediamine pyrochatechol (EDP), selectively attack different crystallographic orientations at different rates, and thus can be used to define relatively accurate sidewalls in the etch pits being created. Etch masks and etch stops are used to prevent predetermined regions of the substrate from being etched.

On the other hand, surface micromachining generally involves forming three-dimensional structures by depositing a number of different thin films on the top of a silicon wafer, but without sculpting the wafer itself. The films usually serve as either structural or sacrificial layers. Structural layers are frequently composed of polysilicon, silicon nitride, silicon dioxide, silicon carbide, or aluminum. Sacrificial layers are frequently composed of polysilicon, photoresist material, polyimide, metals or various kinds of oxides, such as PSG (phosphosilicate glass) and LTO (low-temperature oxide). Successive deposition, etching, and patterning procedures are carried out to arrive at the desired microstructure. In a typical surface micromachining process, a silicon substrate is coated with an isolation layer, and a sacrificial layer is deposited on the coated substrate. Windows are opened in the sacrificial layer, and a structural layer is then deposited and etched. The sacrificial layer is then selectively etched to form a free-standing, movable microstructure such as a beam or a cantilever out of the structural layer. The microstructure, or microcomponent, is ordinarily anchored to the silicon substrate, and can be designed to be movable in response to an input from an appropriate actuating mechanism.

Many MEMS switch designs employ a cantilievered beam (or plate), or multiple-supported beam geometry for the switching structure. In the case of cantilevered beams, these MEMS switches include a movable, bimaterial beam comprising a structural layer of dielectric material and a layer of metal. Typically, the dielectric material is fixed at one end with respect to the substrate and provides structural support for the beam. The layer of metal is attached on the underside of the dielectric material and forms a movable electrode and a movable contact. The layer of metal can form part of the anchor. The movable beam is actuated in a direction toward the substrate by the application of a voltage difference across the electrode and another electrode attached to the surface of the substrate. The application of the voltage difference to the two electrodes creates an electrostatic field, which pulls the beam towards the substrate. The beam and substrate each have a contact which is separated by an air gap when no voltage is applied, wherein the switch is in the "open" position. When the voltage difference is applied, the beam is pulled to the substrate and the contacts make an electrical connection, wherein the switch is in the "closed" position.

One of the problems that faces current MEMS switches having a bimaterial beam is curling or other forms of static displacement or deformation of the beam. The static deformation can be caused by a stress mismatch or a stress gradient within the films. At some equilibrium temperature, the mismatch effects could be balanced to achieve a flat bimaterial structure, but this does not fix the temperature dependent effects. The mismatch could be balanced through specific processes (i.e., deposition rates, pressures, method, etc.), through material selection, and through geometrical parameters such as thickness. This bimaterial structure of metal and dielectric introduces a large variation in function over temperature, because the metal will typically have a higher thermal expansion rate than the dielectric. Because of the different states of static stress in the two materials, the switch can be deformed with a high degree of variability. Switch failure can result from deformation of the beam. Switch failure results when electrical contact is not established between the movable and stationary contacts due to static deformation or because of the deformation introduced as a function of temperature. A second mode of failure is observed when the movable contact and the stationary contact are prematurely closed, resulting in a "short". Because of the deformation of the beam, the actuation voltage is increased or decreased depending on whether it is curved away from the substrate or towards the substrate, respectively. Because of this variability, the available voltage may not be adequate to achieve the desired contact force and, thus, contact resistance.

Many MEMS switches are designed with stiffer beams in order to avoid curling or deformation for improving switch reliability. These MEMS switches require higher actuation voltage in order to deflect the beam to a "closed" position. It is desirable to reduce the actuation voltage required to close MEMS switches for power conservation. A higher voltage is required to deflect the beam to a "closed" position than to maintain the beam in a "closed" position. Thus, in order to minimize the power required for operating the switch, it is desirable to use minimal power to reduce the power for actuating the beam and maintaining the beam in the "closed" position.

Typically, the beam of a MEMS switch is restored to an "open" position from a "closed" position by reducing the actuation voltage an amount sufficient for the resilient forces of the beam to deflect the beam back to the "open" position. The contacts of a MEMS switch frequently adhere to one another due metallurgical adhesion, cold welding, or hot welding forces. These forces are sometimes greater than the resilient forces of the beam, thus preventing the deflection of the beam to the "open" position. In such cases, switch failure results because the beam does not return to the "open" position. Therefore, it is desired to have a MEMS switch having a mechanism for generating a force to return the beam to an "open" position.

SUMMARY

According to one embodiment, a movable microcomponent suspended over a substrate is provided. The movable microcomponent can include a dielectric layer having at least one end fixed with respect to the substrate. The microcomponent can also include a movable electrode attached to the dielectric layer and separated from the substrate. Furthermore, the microcomponent can include an electrothermal component attached to the dielectric layer and operable to produce heat for deflecting the dielectric layer.

According to a second embodiment, a microscale switch for electrostatic and electrothermal actuation is provided. The switch can include a substrate and a stationary electrode and stationary contact formed on the substrate. The switch can also include a movable microcomponent suspended above the substrate. The microcomponent can include a dielectric layer including at least one end fixed with respect to the substrate. The microcomponent can also include a movable electrode spaced from the stationary electrode and a movable contact spaced from the stationary electrode. Furthermore, the microcomponent can include an electrothermal component attached to the dielectric layer and operable to produce heating for generating force for moving the dielectric layer.

According to a third embodiment, a method for implementing a switching function in a microscale device is provided. The method can include providing a stationary electrode and a stationary contact formed on a substrate. The method can further include providing a movable microcomponent suspended above the substrate. The microcomponent can include a dielectric layer including at least one end fixed with respect to the substrate. The microcomponent can also include a movable electrode spaced from the stationary electrode and a movable contact spaced from the stationary electrode. The movable contact can be positioned farther from the at least one end than the movable electrode. The microcomponent can include an electrothermal component attached to the dielectric layer. The method can include applying a voltage between the movable electrode and the stationary electrode to electrostatically couple the movable electrode with the stationary electrode, whereby the movable component is deflected toward the substrate and the movable contact moves into contact with the stationary contact to permit an electrical signal to pass through the movable and stationary contacts. Furthermore, the method can include applying a current through the first electrothermal component to produce heating for generating force for moving the microcomponent.

According to a fourth embodiment, a method for fabricating a microscale switch is provided. The method can include depositing a first conductive layer on a substrate and forming a stationary electrode and a stationary contact by removing a portion of the first conductive layer. The method can also include depositing a sacrificial layer on the stationary electrode, the stationary contact, and the substrate. Additionally, the method can include depositing a second conductive layer on the sacrificial layer and forming a movable electrode and a movable contact by removing a portion of the second conductive layer. The method can also include depositing a third conductive layer on the dielectric layer and removing a portion of the third conductive layer to form an electrothermal component. Furthermore, the method can include removing a sufficient amount of the sacrificial layer so as to define a first gap between the stationary electrode and the movable electrode, and to define a second gap between the stationary contact and the movable contact.

According to a fifth embodiment, a method for fabricating a microscale switch is provided. The method can include depositing a first conductive layer on a substrate and forming a stationary electrode and a stationary contact by removing a portion of the first conductive layer. The method can further include depositing a sacrificial layer on the stationary electrode, the stationary contact, and the substrate. Additionally, the method can include depositing a second conductive layer on the sacrificial layer and forming a movable electrode, a movable contact, and an electrothermal component by removing a portion of the second conductive layer. Furthermore, the method can include removing a sufficient amount of the sacrificial layer so as to define a first gap between the stationary electrode and the movable electrode, and to define a second gap between the stationary contact and the movable contact.

According to a sixth embodiment, a method for implementing a switching function in a microscale device having a movable microcomponent is provided. The method can include applying a voltage between a movable electrode and a stationary electrode of the microscale device for electrostatically coupling the movable electrode with the stationary electrode, whereby the movable microcomponent is deflected and a movable contact moves into contact with a stationary contact to permit an electrical signal to pass through the movable and stationary contacts. The method can also includes applying a current through a first electrothermal component of the microscale device to produce heating for generating force for moving the microcomponent.

Accordingly, it is an object of the present invention to provide a movable microcomponent for improving the yield, performance over temperature, actuation, and quality of MEMS switches.

An object having been stated hereinabove, and which is achieved in whole or in part by the described MEMS device having electrothermal actuation and release and method for fabricating described herein, other objects will become evident as the description proceeds when taken in connection with the accompanying drawings as best described hereinbelow.

BRIEF DESCRIPTION OF THE DRAWINGS

Exemplary embodiments of the invention will now be explained with reference to the accompanying drawings, of which.

DETAILED DESCRIPTION OF THE INVENTION

For purposes of the description herein, it is understood that when a component such as a layer or substrate is referred to as being "disposed on", "attached to" or "formed on" another component, that component can be directly on the other component or, alternatively, intervening components (for example, one or more buffer or transition layers, interlayers, electrodes or contacts) can also be present. Furthermore, it is understood that the terms "disposed on", "attached to" and "formed on" are used interchangeably to describe how a given component can be positioned or situated in relation to another component. Therefore, it will be understood that the terms "disposed on", "attached to" and "formed on" do not introduce any limitations relating to particular methods of material transport, deposition, or fabrication.

Contacts, interconnects, conductive vias, electrothermal components and electrodes of various metals can be formed by sputtering, CVD, or evaporation. If gold, nickel or PERMALLOY™ ($Ni_xFe_y$) is employed as the metal element, an electroplating process can be carried out to transport the material to a desired surface. The chemical solutions used in the electroplating of various metals are generally known. Some metals, such as gold, might require an appropriate intermediate adhesion layer to prevent peeling. Examples of adhesion material often used include chromium, titanium, or an alloy such as titanium-tungsten (TiW). Some metal combinations can require a diffusion barrier to prevent a chromium adhesion layer from diffusing through gold. Examples of diffusion barriers between gold and chromium include platinum or nickel.

Conventional lithographic techniques can be employed in accordance with fabrication, such as micromachining, of the invention described herein. Accordingly, basic lithographic process steps such as photoresist application, optical exposure, and the use of developers are not described in detail herein.

Similarly, generally known etching processes can be suitably employed to selectively remove material or regions of material. An imaged photoresist layer is ordinarily used as a masking template. A pattern can be etched directly into the bulk of a substrate, or into a thin film or layer that is then used as a mask for subsequent etching steps.

The type of etching process employed in a particular fabrication step (e.g., wet, dry, isotropic, anisotropic, anisotropic-orientation dependent), the etch rate, and the type of etchant used will depend on the composition of material to be removed, the composition of any masking or etch-stop layer to be used, and the profile of the etched region to be formed. As examples, poly-etch ($HF:HNO_3:CH_3COOH$) can generally be used for isotropic wet etching. Hydroxides of alkali metals (e.g., KOH), simple ammonium hydroxide ($NH_4OH$), quaternary (tetramethyl) ammonium hydroxide (($CH_3)_4NOH$, also known commercially as TMAH), and ethylenediamine mixed with pyrochatechol in water (EDP) can be used for anisotropic wet etching to fabricate V-shaped or tapered grooves, trenches or cavities. Silicon nitride can typically be used as the masking material against etching by KOH, and thus can used in conjunction with the selective etching of silicon. Silicon dioxide is slowly etched by KOH, and thus can be used as a masking layer if the etch time is short. While KOH will etch undoped silicon, heavily doped (p++) silicon can be used as an etch-stop against KOH as well as the other alkaline etchants and EDP. Silicon oxide and silicon nitride can be used as masks against TMAH and EDP. The preferred metal used to form contacts and interconnects in accordance with the invention is gold and its alloys.

It will be appreciated that electrochemical etching in hydroxide solution can be performed instead of timed wet etching. For example, if a p-type silicon wafer is used as a substrate, an etch-stop can be created by epitaxially growing an n-type silicon end layer to form a p-n junction diode. A voltage can be applied between the n-type layer and an electrode disposed in the solution to reverse-bias the p-n junction. As a result, the bulk p-type silicon is etched through a mask down to the p-n junction, stopping at the n-type layer. Furthermore, photovoltaic and galvanic etch-stop techniques are also suitable.

Dry etching techniques such as plasma-phase etching and reactive ion etching (RIE) can also be used to remove silicon and its oxides and nitrides, as well as various metals. Deep reactive ion etching (DRIE) can be used to anisotropically etch deep, vertical trenches in bulk layers. Silicon dioxide is typically used as an etch-stop against DRIE, and thus structures containing a buried silicon dioxide layer, such as silicon-on-insulator (SOI) wafers, can be used according to the methods of the invention as starting substrates for the fabrication of microstructures.

An alternative patterning process to etching is the lift-off process as known to those of skill in the art. In this case, the conventional photolithography techniques are used for the negative image of the desired pattern. This process is typically used to pattern metals, which are deposited as a continuous film or films when adhesion layers and diffusion barriers are needed. The metal is deposited on the regions where it is to be patterned and on top of the photoresist mask (negative image). The photoresist and metal on top are removed to leave behind the desired pattern of metal.

As used herein, the term "device" is interpreted to have a meaning interchangeable with the term "component." As used herein, the term "conductive" is generally taken to encompass both conducting and semi-conducting materials.

Examples will now be described with reference to the accompanying drawings.

Figure 1:
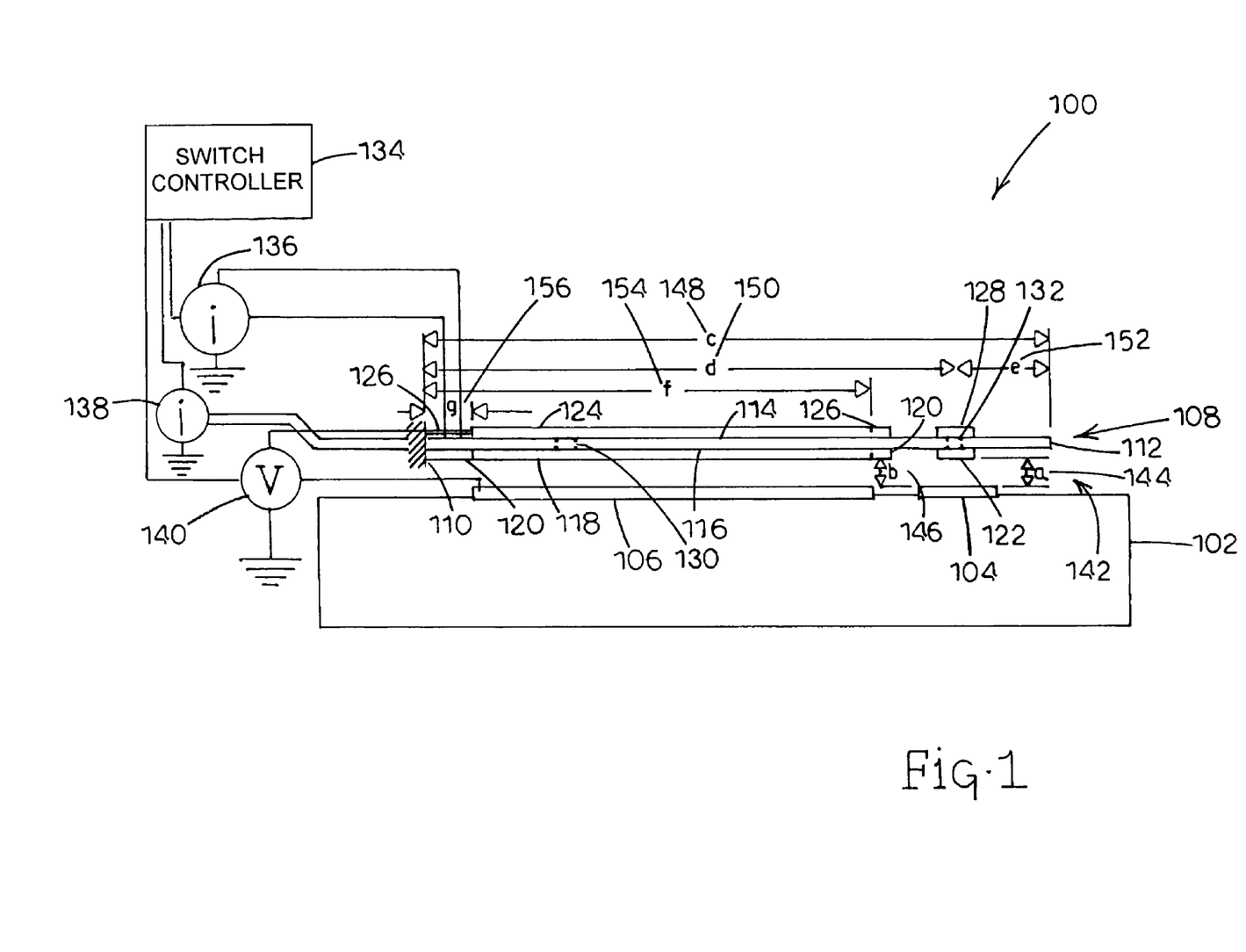
FIG. 1 illustrates a cross-sectional side view of a MEMS switch having electrothermal actuation and release in an "open" position.

Referring to FIGS. 1-5, different views of a MEMS switch, generally designated 100, having electrothermal enhanced actuation and release are illustrated. Referring specifically to FIG. 1, a cross-sectional side view of MEMS switch, generally designated 100, is illustrated in an "open" position. MEMS switch 100 includes a substrate 102. Non-limiting examples of materials which substrate 102 can comprise silicon (in single-crystal, polycrystalline, or amorphous forms), silicon oxinitride, glass, quartz, sapphire, zinc oxide, alumina, silica, or one of the various Group III-V compounds in either binary, ternary or quaternary forms (e.g., GaAs, InP, GaN, AlN, AlGaN, InGaAs, and so on). If the composition of substrate 102 is chosen to be a conductive or semi-conductive material, a non-conductive, dielectric layer can be deposited on the top surface of substrate 102, or at least on portions of the top surface where electrical contacts or conductive regions are desired.

Substrate 102 includes a first stationary contact 104, a second stationary contact (not shown in this view due to its positioning behind first stationary contact 104), and a stationary electrode 106 formed on a surface thereof. First stationary contact 104, the second stationary contact, and stationary electrode 106 can comprise a conductive material such as a metal. Specifically, first stationary contact 104, the second stationary contact, and stationary electrode 106 can comprise different conductive materials such as gold-nickel alloy ($AuNi_5$) and aluminum or other suitable conductive materials known to those of skill in the art. The conductivity of stationary electrode 106 can be much lower than the conductivity of first stationary contact 104 and the second stationary contact. Preferably, first stationary contact 104 and the second stationary contact can comprise a very high conductive material such as copper. Preferably, first stationary contact 104 and the second stationary contact can have a width range of 7 μm to 100 μm and a length range of 15 μm to 75 μm. Stationary electrode 106 can have a wide range of dimensions depending on the required actuation voltages, contact resistance, and other functional parameters.

MEMS switch 100 further comprises a movable, trilayered beam, generally designated 108, suspended over first stationary contact 104, the second stationary contact, and stationary electrode 106. Beam 108 is fixedly attached at one end to a mount 110, which can be fixedly attached to substrate 102. Beam 108 extends substantially parallel to the top surface of substrate 102 when MEMS switch 100 is in an "open" position. Beam 108 generally comprises a dielectric structural layer 112 disposed between two electrically conductive layers described in more detail below. Structural layer 112 can comprise a bendable material, preferably silicon oxide ($SiO_2$, as it is sputtered, electroplated, spun-on, or otherwise deposited), to deflect towards substrate 102 for operating in a "closed" position. Structural layer 112 provides electrical isolation and desirable mechanical properties including resiliency properties. Alternatively, structural layer 112 can comprise silicon nitride ($Si_xN_y$), silicon oxynitride, alumina or aluminum oxide ($Al_xO_y$), polymers, CVD diamond, their alloys, or any other suitable resilient materials known to those of skill in the art. Beam 108 is designed to be resilient for generating a restorative force to return the beam to its natural position when beam 108 is deflected or bent.

In this embodiment, beam 108 further includes a top and bottom layer attached to a top side 114 and an underside 116, respectively, thereof. The bottom layer comprises a movable electrode 118, a release electrothermal component 120, and a movable contact 122. Movable electrode 118 is shown with broken lines in this view due to its position behind release electrothermal component 120. The top layer comprises an electrode interconnect 124, an actuation electrothermal component 126, and a contact interconnect 128. Electrode interconnect 124 is shown with broken lines in this view due to its position behind actuation electrothermal component 126. As shown, movable contact 118 and contact interconnect 128 are positioned further away from mount 110 than movable electrode 118 and electrode interconnect 124. Release electrothermal component 120 and actuation electrothermal component 126 extend substantially the length of beam 108. Alternatively, release electrothermal component 120 and actuation electrothermal component 126 can extend from mount 110 to any other suitable location on beam 108.

Movable electrode 118 is positioned over stationary electrode 106 and displaced from stationary electrode 106 such that application of a voltage difference across electrodes 106 and 118 creates an electrostatic field, which causes an attractive force between electrodes 106 and 118. Upon application of the voltage difference across electrodes 106 and 118, beam 108 bends in a direction towards substrate 102. In this embodiment, actuation electrothermal component 126 is a closed electrical circuit including current paths and resistance path transitions, shown and described in more detail below. Alternatively, the resistance path transition can be realized by a change in thickness instead of the change in width that is portrayed. Alternatively, electrothermal components 120 and 126 can comprise material transitions rather than area transitions to accomplish the resistance path transitions. The material transitions are realized by patterning different materials on either side of the resistance path transition. For example, nickel (Ni) and gold (Au) can be patterned on the first and second side of the resistance path transition. Any suitable materials having differing thermal and mechanical properties known to those of skill in the art can be used to achieve resistance path transitions. The magnitude of the localized heating is determined by the difference in the geometric or material properties. The resistance path transitions provide local heating and local generation of force at a suitable location on the top side 114 of structural layer 112 for facilitating deflection of beam 108 towards substrate 102. The combination of electrostatic and electrothermal forces deflect beam 108 towards substrate 102. The operation of the actuation electrothermal component 126 and electrodes 106 and 118 is described in further detail below.

The applied voltage difference between electrodes 106 and 118 can be reduced with the addition of the force generated by electrothermal actuation of electrothermal component 126. This voltage reduction is desirable for achieving switching voltages on the order of 5 volts. Further, with the addition of electrothermal actuation, structural layer 112 can be designed stiffer and still actuate at a lower applied voltage. The increased beam stiffness tends to lower the switching speed and increase the reliability of achieving release from a "closed" position.

Electrodes 106 and 118, contacts 104 and 122, release electrothermal component 120, actuation electrothermal component 126, and interconnects 124 and 128 can comprise similar materials, such as gold, whereby the manufacturing process is simplified by the minimization of the number of different materials required for fabrication. Additionally, electrodes 106 and 118, contacts 104 and 122, release electrothermal component 120, actuation electrothermal component 126, and interconnects 124 and 128 can comprise conductors (platinum, aluminum, palladium, copper, tungsten, nickel, and other materials known to those of skill in the art), conductive oxides (indium tin oxide), and low resistivity semiconductors (silicon, polysilicon, and other materials known to those of skill in the art). These components can include adhesion layers (Cr, Ti, TiW, etc.) disposed between the component and structural layer 112. These components can comprise a conductive material and an adhesion layer that includes diffusion barriers for preventing diffusion of the adhesion layer through the electrode material, or diffusion through the conductive material into the structural material. These components can also comprise different materials for breakdown or arcing considerations, for "stiction" considerations during wet chemical processing, or because of fabrications process compatibility issues. Contacts 104 and 122 can comprise a material having good conductive properties and other desirable properties of suitable contacts known to those of skill in the art, such as low hardness and low wear. Preferably, electrodes 106 and 118 comprise a material having low resistivity, low hardness, low oxidation, low wear, and other desirable properties of suitable contacts known to those of skill in the art. Preferably, electrothermal components 120 and 126 comprise a material having high resistivity, high softening/melting point, and high current capacity. The preferred properties contribute to high localized heating for development of larger deflections and forces. The high softening/melting point and high current capacity increase the reliability of the device during electrothermal operation. In this embodiment, electrothermal components 120 and 126 comprise the same material. Alternatively, electrothermal components 120 and 126 can comprise different materials.

Movable contact 122 is positioned over first stationary contact 104 and the second stationary contact such that it contacts first stationary contact 104 and the second stationary contact when beam 108 is moved to the "closed" position, thus providing electrical communication between first stationary contact 104 and the second stationary contact through movable contact 122. Movable contact 122 is displaced from first stationary contact 104 and the second stationary contact when MEMS switch 100 operates in the "open" position such that there is no electrical communication between first stationary contact 104 and the second stationary contact. Movable contact 122 can be dimensioned smaller than first stationary contact 104 and the second stationary contact to facilitate contact when process variability and alignment variability are taken into consideration. First stationary contact 104 and the second stationary contact need to be sized appropriately so that movable contact 122 always makes contact with first stationary contact 104 and the second stationary contact when in the "closed" position. A second consideration that determines the size of movable contact 122, first stationary contact 104, and the second stationary contact is the parasitic response of switch 100. The parasitic actuation response is generated by electric fields produced by potential differences between movable electrodes 106 and 118, or by charge (or potential) differences between first stationary electrode 106 and second stationary contact and beam 108 that produce electric fields and a force on movable contact 122. The dimensions of movable contact 122 are related to the dimensions of movable electrode 118 to achieve a specific ratio of the parasitic actuation to the actuation voltage.

Electrode interconnect 124 and movable electrode 118 are attached to opposing sides of structural layer 112. Preferably, movable electrode 118 and electrode interconnect 124 have substantially the same dimensions and are aligned with one another for achieving a manufacturable flatness that is maintained over temperature. In this embodiment, electrode interconnect 124 comprises a conductive material having the same coefficient of thermal expansion, elastic modulus, residual film stress, and other electrical/mechanical properties as movable electrode 118.

Movable electrode 118 and electrode interconnect 124 are in electrical communication with one another by connection to a first interconnect via 130. First interconnect via 130 is indicated by broken lines in this view due to its placement inside structural layer 112. First interconnect via 130 comprises a conductive material formed through structural layer 112. In this embodiment, first interconnect via 130 comprises the same conductive material as movable electrode 118 and electrode interconnect 124. Alternatively, first interconnect via 130 can comprise any suitable conductive material known to those of skill in the art, such as low wear and low hardness.

Movable contact 122 and contact interconnect 128 are attached to and aligned on opposing sides of structural layer 112. Contact interconnect 128 is dimensioned substantially the same as movable contact 122. Alternatively, contact interconnect 128 can have different dimensions and extent than movable contact 122. It is intended to maintain geometric equivalence by management of the mechanical form. Contact interconnect 128 and movable contact 122 are intended to share a geometrical and thermo-mechanical equivalence. This equivalence provides a beam, which can achieve a manufacturable flatness that is maintained over temperature and other environmental conditions, such as die attachment, package lid seal processes, or solder reflow process. In this embodiment, contact interconnect 128 comprises a conductive material, such as copper for example, having the same coefficient of thermal expansion, elastic modulus, residual film stress, and other desirable electrical/mechanical properties known to those of skill in the art as movable contact 122.

Movable contact 122 and contact interconnect 128 are in electrical communication with one another by connection to a second interconnect via 132. Second interconnect via 132 is indicated by broken lines due to its placement inside structural layer 112. Second interconnect via 132 comprises a conductive material, such as copper for example, formed through structural layer 112 for electrically connecting movable contact 122 and contact interconnect 128. In this embodiment, second interconnect via 132 can comprise the same conductive material as contact interconnect 128 and movable contact 122. Alternatively, second interconnect via 132 can comprise a different conductive material as contact interconnect 128 and movable contact 122.

MEMS switch 100 further includes a switch controller 134 connected to and operable to transmit control signals to a first current source 136, a second current source 138, and a voltage source 140 for controlling the electrostatic and electrothermal actuation of switch 100 by application of voltage and current. Switch controller 134 is also operable to transmit control signals to other switches in an array of switches. First current source 136, second current source 138, and voltage source 140 are operable to output voltage and current in response to receiving control signals from switch controller 134.

Figure 2:
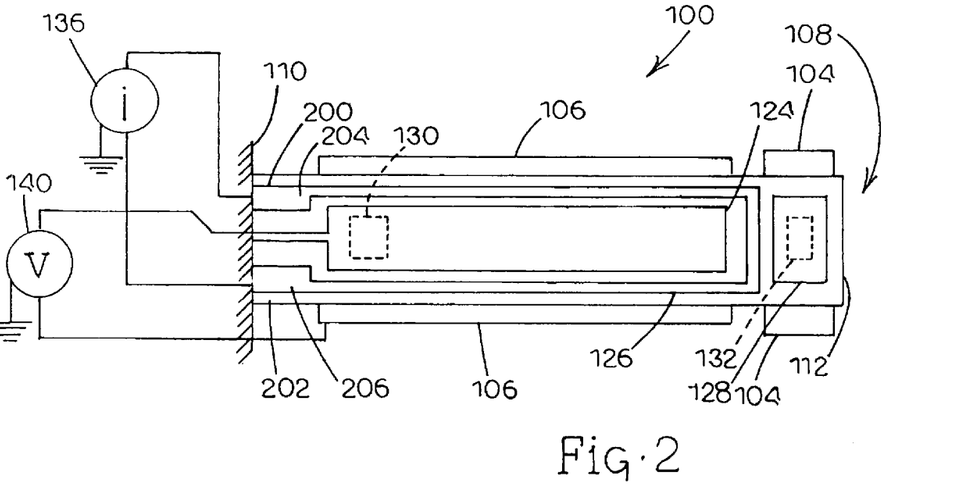
FIG. 2 illustrates a top plan view of a MEMS switch having electrothermal actuation and release.

Referring to FIG. 2, a top view of MEMS switch 100 is illustrated. As shown, actuation electrothermal component 126 is connected at two ends 200 and 202 to the output of first current source 136. In this embodiment, actuation electrothermal component 126 extends from ends 200 and 202 around electrode interconnect 124 for providing a conductive path along the length of beam 108 for current applied by first current source 136. Alternatively, the conductive path can extend around both electrode interconnect 124 and contact interconnect 128. Actuation electrothermal component 126 further includes resistance path transitions 204 and 206 at which the current paths change from a low resistance path to a high resistance path for providing local heating and local generation of force to aid actuation of beam 108. The location of resistance path transitions 204 and 206 and the ratio of the transition can be optimized for maximal force without damaging the component due to electrical overstress. Resistive heating along the length of the actuation electrothermal component 126 will also provide the elongation that aids the actuation of beam 108. Thermal isolation is provided between actuation electrothermal component 126 and electrode interconnect 124 by an air gap, generally designated 142, between the components and structural layer 112 which serves as an insulator.

As shown, electrode interconnect 124 and contact interconnect 128 are generally rectangular in shape. The external corners of electrode interconnect 124 and contact interconnect 128 can be rounded to contain internal reentrant corners for reducing the intensification in the electric fields produced by the potential differences between conductors. In this embodiment, electrode interconnect 124 can be dimensioned the same as movable electrode 118. Alternatively, electrode interconnect 124 can be any suitable non-rectangular shape that substantially matches the shape of movable electrode 118. The shape of contact interconnect 128 substantially matches the shape of movable contact 122. Interconnect vias 130 and 132 are rectangular and shown by broken lines due to their position behind electrode interconnect 124 and contact interconnect 128, respectively. Alternatively, interconnect vias 130 and 132 can be any geometry suitable for vias including circular, elliptical, or rectangular with rounded corners.

Figure 3:
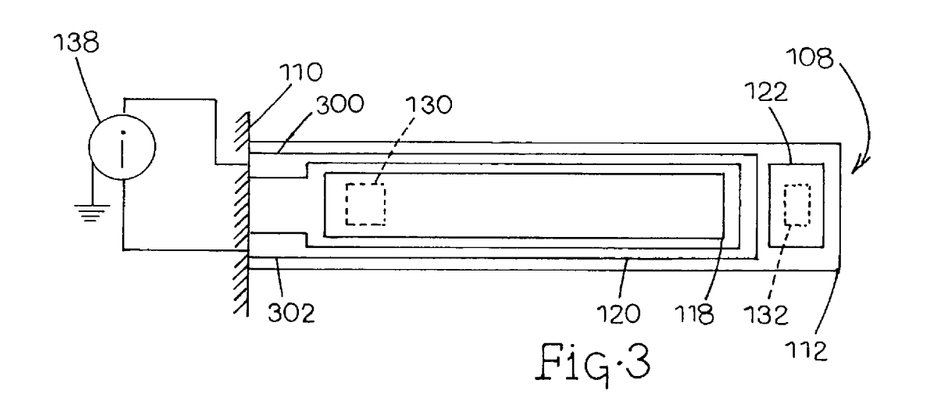
FIG. 3 illustrates a bottom plan view of a beam of a MEMS switch having electrothermal actuation and release.

Referring to FIG. 3, a bottom view of beam 108 of MEMS switch 100 is illustrated. Release electrothermal component 120 is connected at two ends 300 and 302 to the output of second current source 138. In this embodiment, release electrothermal component 120 extends from ends 300 and 302 around movable contact 122 along the length of beam 108 for providing a conductive path for current applied by second current source 138. Alternatively, the conductive path can extend around movable electrode 118 and movable contact 122. Release electrothermal component 120 further includes resistance path transitions 304 and 306 at which the current paths change from a low resistance path to a high resistance path for providing local heating and local generation of force to aid release of beam 108 from a "closed" position, as described below. The location of resistance path transitions 304 and 306 and the ratio of the transition can be optimized for maximal force without damaging the component due to electrical overstress. Resistive heating along the length of the release electrothermal component 120 will also provide the elongation that aids the release of beam 108 from the "open" position. Thermal isolation is provided between release electrothermal component 120 and movable electrode 118 by air gap 142 between the components and structural layer 112 which serves as an insulator.

Figure 4:
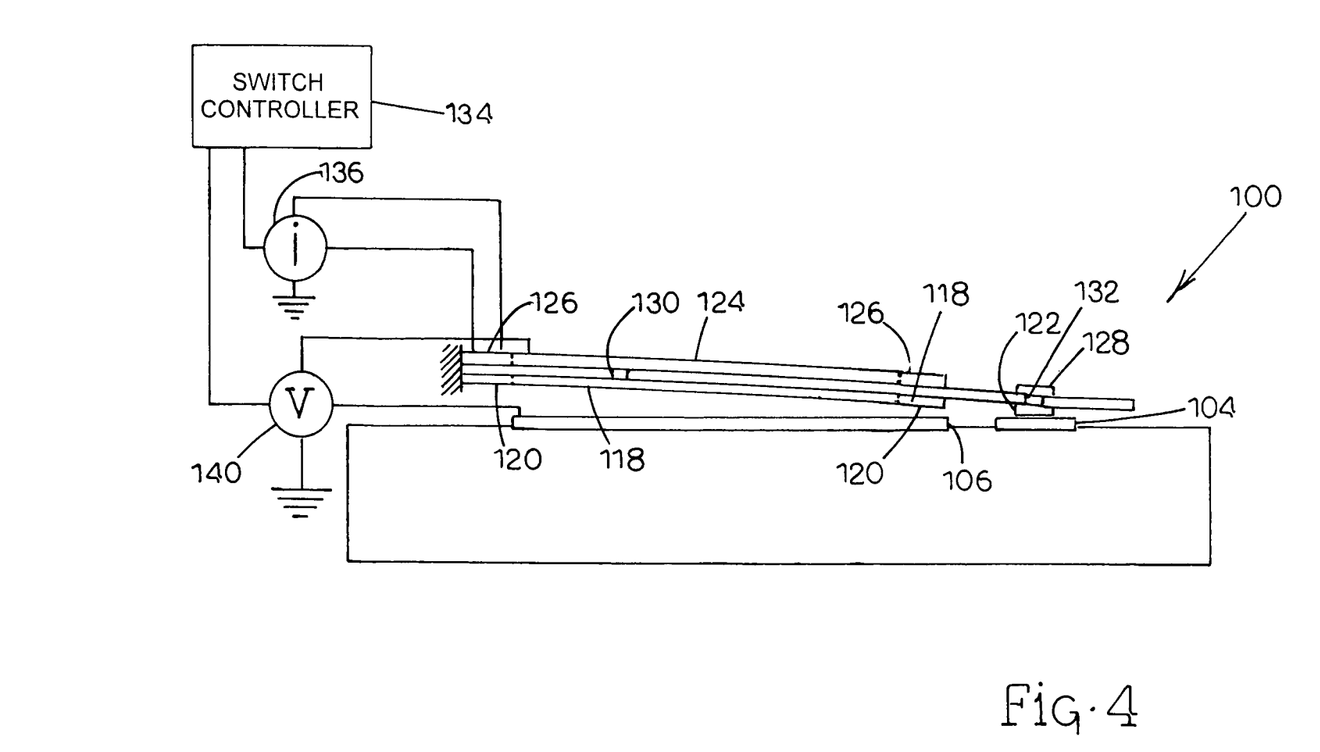
FIG. 4 illustrates a cross-sectional side view of a MEMS switch having electrothermal actuation and release in a "closed" position.

Upon the application of sufficient voltage and current by voltage source 140 and first current source 136, respectively, beam 108 moves toward substrate 102 in a stable manner until beam 108 is close enough to substrate 102 for "pull-in" voltage, or "snap-in" voltage, to occur. After "pull-in" voltage occurs, beam 108 moves towards substrate 102 in an unstable manner until movable contact 122 touches first stationary contact 104 and the second stationary contact, thus establishing an electrical connection between first stationary contact 104 and the second stationary contact. Referring to FIG. 4, a cross-sectional side view of MEMS switch 100 in a "closed" position is illustrated. In the "closed" position, movable contact 122 is touching first stationary contact 104 and the second stationary contact, thus establishing an electrical connection between first stationary contact 104 and the second stationary contact. As described below, the components of MEMS switch 100 can be dimensioned such that movable electrode 118 and stationary electrode 106 do not contact in the "closed" position, thus preventing a short between components 106 and 118. MEMS switch 100 can be maintained in position by applying only the potential voltage difference between movable electrode 118 and stationary electrode 106. The application of current to actuation electrothermal component 126 is not required to maintain MEMS switch 100 in the "closed" position, thus reducing the power required for operating actuation electrothermal component 126. Switch controller 134 is operable to receive feedback signals indicating a "closed" condition and turn off first current source 136 in response to receiving the signal.

MEMS switch 100 is returned to an "open" position by sufficiently reducing or removing the voltage difference applied across stationary electrode 106 and movable electrode 118. This in turn reduces the attractive force between stationary electrode 106 and movable electrode 118 such that the resilient force of structural layer 112 restores structural layer 112 to an "open" position. If movable contact 118 adheres to stationary contact 104, current can be briefly applied by second current source 138 to the release electrothermal component 120 to "break" the contact. After release from the contact, the resilient force of structural layer 112 can restore beam 108 to an "open" position. Switch controller 134 is operable to control voltage source 140 for reducing or removing the applied voltage and activating second current source 136 to apply current to release electrothermal component 120 for restoring beam 108 to the "open" position.

Referring again to FIG. 1, voltage source 140 can be directly connected to stationary electrode 106 and electrode interconnect 124. Movable electrode 118 is electrically connected to voltage source 140 through first interconnect via 130 and electrode interconnect 124. First interconnect via 130 provides an electrical connection between electrode interconnect 124 and movable electrode 118. Therefore, upon the application of a voltage by voltage source 140, a voltage difference is created between stationary electrode 106 and movable electrode 118. This establishes electrostatic coupling between movable electrode 118 and stationary electrode 106 across air gap 142. Alternatively, the gap between movable electrode 118 and stationary electrode 106 can be any suitable isolating fluid/gas as known to those of skill in the art, such as for example $SF_6$, a high breakdown voltage and arc quenching gas.

Preferably, movable electrode 118 and electrode interconnect 124 are fabricated of the same material and dimensioned the same. Additionally, movable contact 122 and contact interconnect 128 are fabricated of the same material and dimensioned the same. First, it provides mechanical balance on both sides of structural layer 112. The mechanical balance is provided because of the elastic symmetry, because the films are deposited in the same way to produce a symmetric stress field, and because the thermal expansion properties are symmetric. The elastic symmetry is preserved by using the same material and by using the same dimensions. The symmetric stress field is produced by depositing the same materials using the same process and thicknesses. The symmetric thermal expansion properties minimize any variation in the switch operation with respect to temperature because the same material is on either side of structural layer 112. This means that any functional variation exhibited by MEMS switch 100 depends primarily on the process variation, which can be minimized by the appropriate optimization of the design in the process. Secondly, because movable contact 122 and contact interconnect 128 are fabricated of the same material and dimensioned the same, the current carrying capacity of contacts 122 and 128 is aided. It is preferable that beam 108 has the same type of metal, deposited by the same process, patterned in the same geometry, and deposited to the same thickness, but the use of different materials could be accommodated with the appropriate design and characterization. To address the issues of contact adhesion, cold welding, or hot welding, first stationary contact 104, the second stationary contact, and movable contact 122 could be different materials or different alloys of the same materials. The material selection can minimize contact resistance and failures such as stiction.

In the "open" position, movable contact 118 is separated from first stationary contact 104 and second stationary contact by a gap distance a 144 as shown in FIG. 1. Movable electrode 118 is separated from stationary electrode 106 by a gap distance b 146. In this embodiment, distance a 142 is less distance b 146. If distance a 144 is less distance b 146, the operation of MEMS switch 100 is more reliable because potential for shorting between stationary electrode 106 and movable electrode 118 is reduced. The length of beam 108 is indicated by a distance c 148. The center of movable contact 122 is a distance d 150 from mount 110 and a distance e 152 from the end of beam 108 that is distal mount 110. The edge of electrode interconnect 124 distal mount 110 is a distance f 154 from mount 110. The edge of electrode interconnect 124 near mount 110 is a distance g 156 from mount 110. In this embodiment, distance a 144 is nominally 1.5 microns; distance b 146 is preferably 2 microns; distance c 148 is preferably 155 microns; distance d 148 is preferably 135 microns; distance e 152 is preferably 20 microns; distance f 154 is preferably 105 microns; and distance g 156 is 10 microns. The distances a 144, b 146, c 148, d 150, e 152, f 154, and g 156 provide desirable functional performance, but other dimensions can be selected to optimize other functional characteristics, manufacturability, and reliability.

Figure 5:
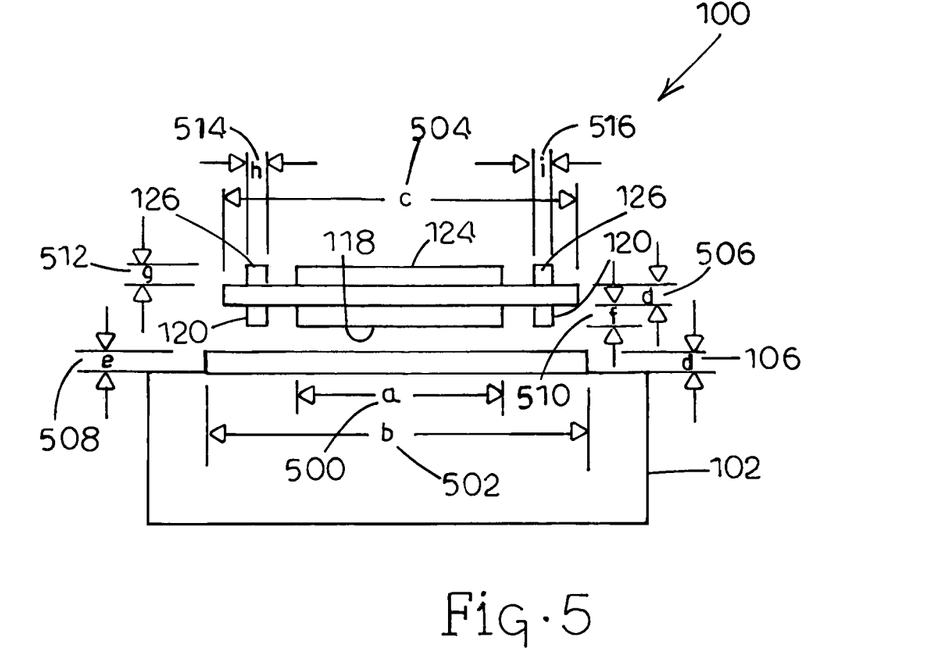
FIG. 5 illustrates a cross-sectional front elevation view of the stationary electrode, structural layer, movable electrode, electrode interconnect, release electrothermal component, and actuation electrothermal component of a MEMS switch having electrothermal actuation and release.

Referring to FIG. 5, a cross-sectional front view of stationary electrode 106, structural layer 112, movable electrode 118, actuation electrothermal component 120, electrode interconnect 124, and release electrothermal component 126 of MEMS switch 100 is illustrated. The width of movable electrode 118 and electrode interconnect 124 is indicated by a distance a 500. Preferably, movable electrode 118 and electrode interconnect 124 are equal in width. Alternatively, movable electrode 118 and electrode interconnect 124 can have different widths. The width of stationary electrode 106 is indicated by distance b 502. The width of structural layer 112 is indicated by distance c 504. The thickness of structural layer 112 is indicated by distance d 506. The thickness of stationary electrode 106 is indicated by distance e 508. The thickness of movable electrode 118 and release electrothermal component 120 is indicated by distance f 510. The thickness of electrode interconnect 124 and actuation electrothermal component 126 is indicated by distance g 512. The conductive paths of release electrothermal component 120 and actuation electrothermal component 126 are indicated by distance h 514 and 1516. First stationary contact 104 and stationary electrode 106 can be dimensioned greater than movable electrode 118 and movable contact 122, respectively, in order to facilitate shielding MEMS switch 100 from any parasitic voltages. In this embodiment, distance a 500 is preferably 75 microns; distance b 502 is preferably 125 microns; distance c 504 is preferably 105 microns; distance d 506 is preferably 2 microns; distance e 508 is preferably 0.5 microns; distance f 510 is preferably 0.5 microns; distance g 512 is preferably 0.5 microns; and distances h 514 and i 516 are preferably microns. The distances a 500, b 502, c 504, d 506, e 508, f 510, g 512, h 514 and i 516 provide desirable functional performance, but other dimensions can be selected to optimize other functional characteristics, manufacturability, and reliability.

Figure 6A:
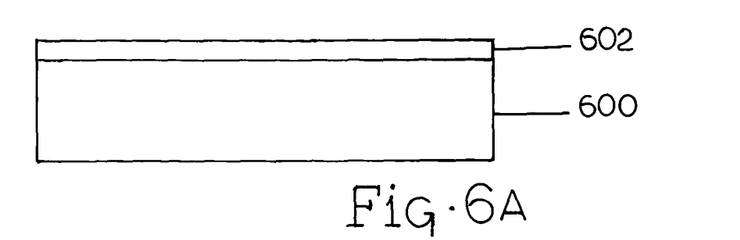
FIGS. 6A-K illustrate fabrication steps of an embodiment of a method for fabricating a MEMS switch having electrothermal actuation and release.

Referring to FIGS. 6A-6K, an embodiment of a method for fabricating a MEMS switch having electrothermal actuation and release according to a surface micromachining process of the present invention will now be described. Referring specifically to FIG. 6A, a substrate 600 is provided, which preferably comprises silicon. Because substrate 600 is a semi-conductive material, a first dielectric layer 602 is deposited on the top surface of substrate 600. Alternatively, dielectric material can be deposited on portions of the top surface where electrical contacts or conductive regions are desired.

Figure 6B:
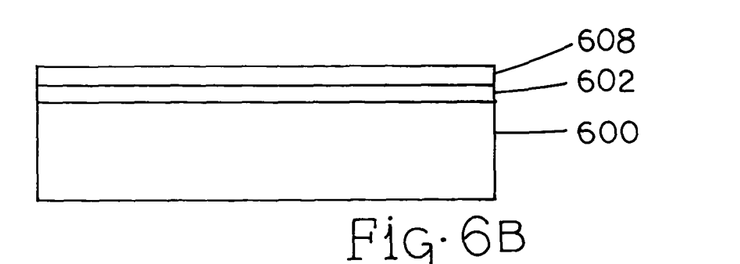
Figure 6C:
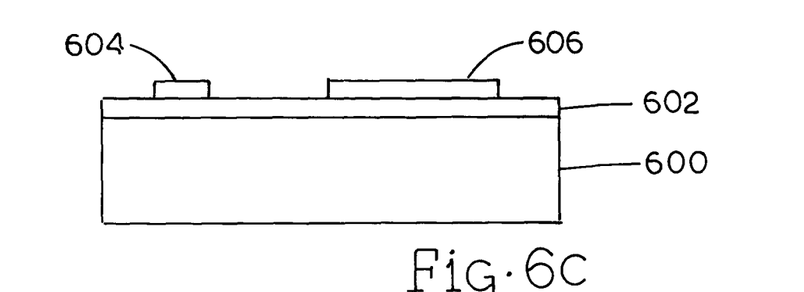

Referring to FIG. 6B-6C, a process for producing a first stationary contact 604, a second stationary contact (not shown due to its positioning behind first stationary contact 604), and a stationary electrode 606 is illustrated. Referring specifically to FIG. 6B, a first conductive layer 608 is deposited on first dielectric layer 602. First conductive layer 608 is patterned as described above. Referring to FIG. 6C, first stationary contact 604, the second stationary contact, and stationary electrode 606 are formed simultaneously in first conductive layer 608. Alternatively, first stationary contact 604, the second stationary contact, and stationary electrode 606 can be formed in separate processes.

Figure 6D:
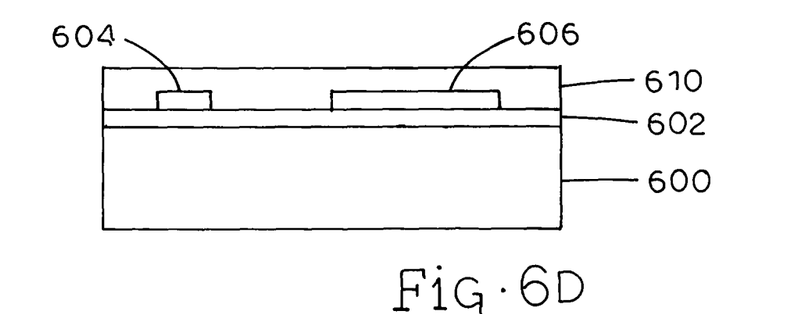

Referring to FIG. 6D, a sacrificial layer 610 is deposited to a uniform thickness such that its top surface is preferably planarized. Sacrificial layer 610 defines the gap between a beam structure, described in further detail below, and first stationary contact 604, the second stationary contact, and stationary electrode 606. Sacrificial layer 610 can be a metal, dielectric or any other suitable material known to those of skill in the art such that the removal chemistry is compatible with the other electrical and structural materials.

Figure 6E:
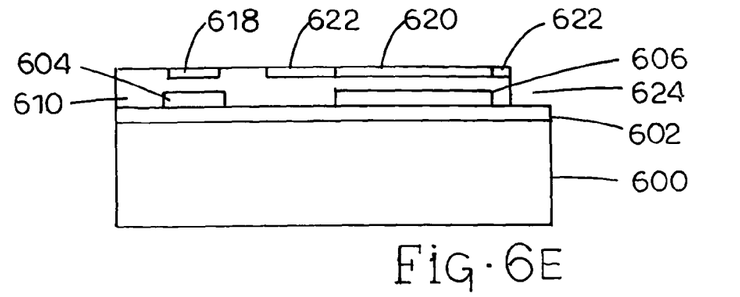
Figure 6F:
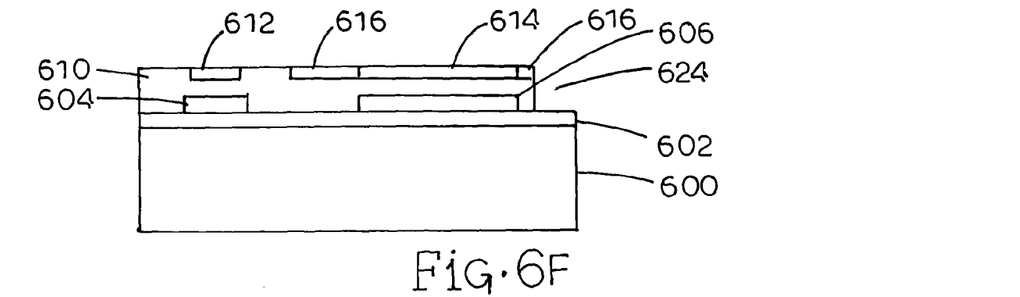

Referring to FIGS. 6E-6F, a process for producing a movable contact 612, a movable electrode 614, and a release electrothermal component 616, as described above, is illustrated. Referring specifically to FIG. 6E, grooves 618, 620, and 622 are etched in sacrificial layer 610 for forming movable contact 612, movable electrode 614, and release electrothermal component 616, respectively. Groove 624 is formed in sacrificial layer 610 for forming a structure to attach the beam to substrate 600 and suspend the beam above first stationary contact 604, the second stationary contact, and stationary electrode 606. Referring now to FIG. 6F, a conductive layer is deposited on sacrificial layer 610 until grooves 618, 620, and 622 are filled. Next, the conductive layer is patterned as described above to form movable contact 612, movable electrode 614, and release electrothermal component 616.

Figure 6G:
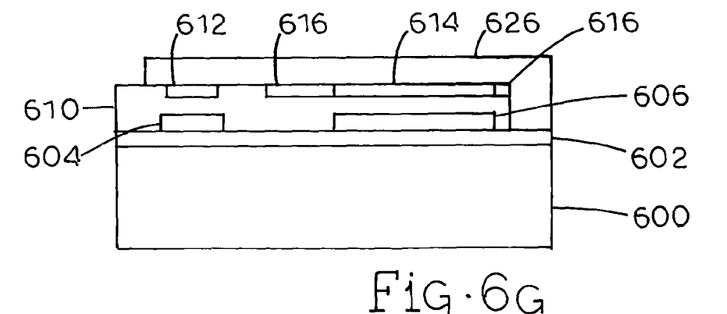

Referring FIG. 6G, a structural layer 626 is deposited on movable contact 612, movable electrode 614, release electrothermal component 616, sacrificial layer 610, and first dielectric layer 602. Structural layer 626 comprises oxide in this embodiment.

Figure 6H:
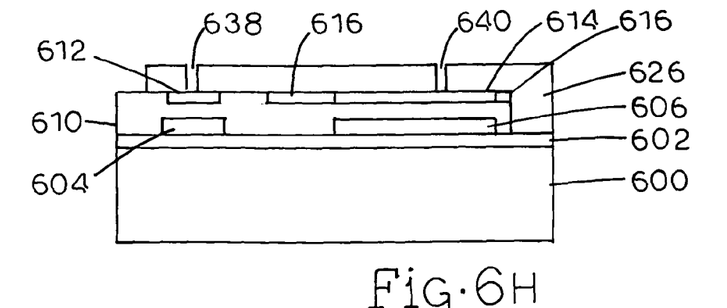
Figure 6I:
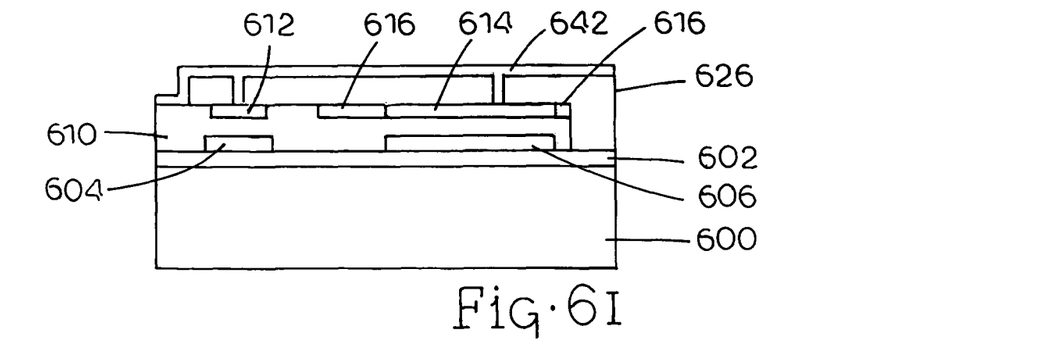
Figure 6J:
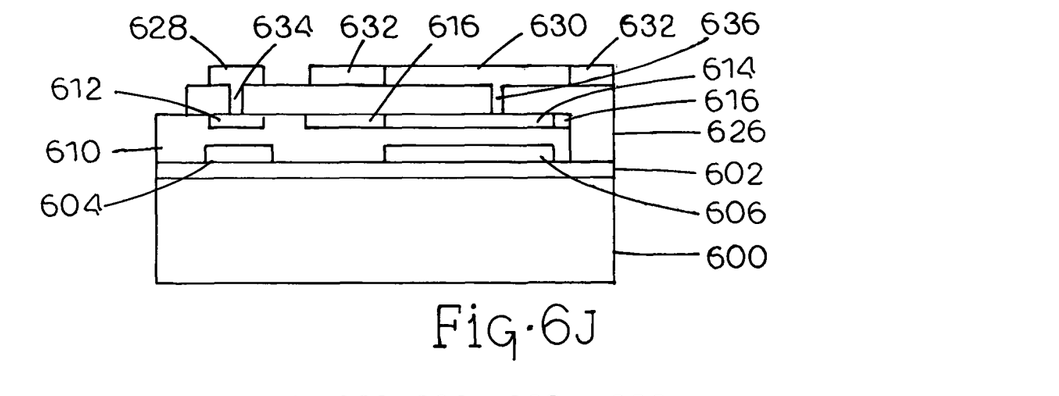

Referring to 6H-6J, a process for simultaneously producing the following conductive microstructures: a contact interconnect 628, an electrode interconnect 630, an actuation electrothermal component 632, and interconnect vias 634 and 636. Referring specifically to FIG. 6H, recesses 638 and 640 are etched into structural layer 626 for forming interconnect vias 634 and 636, respectively. Recesses 638 and 640 are etched through structural layer 626 to movable contact 612 and movable electrode 614, respectively.

Referring now to FIG. 6I, a second conductive layer 642 is deposited on structural layer 626 and into recesses 638 and 640 as shown for forming an electrical connection from movable contact 612 and movable electrode 614 to the top surface of structural layer 626. Next, second conductive layer 642 is patterned for forming contact interconnect 628, electrode interconnect 630, and actuation electrothermal component 632 as shown in FIG. 6J. Interconnect vias 634 and 636 can be formed by another conductive layer that would precede the deposition of second conductive layer 642 described above.

Figure 6K:
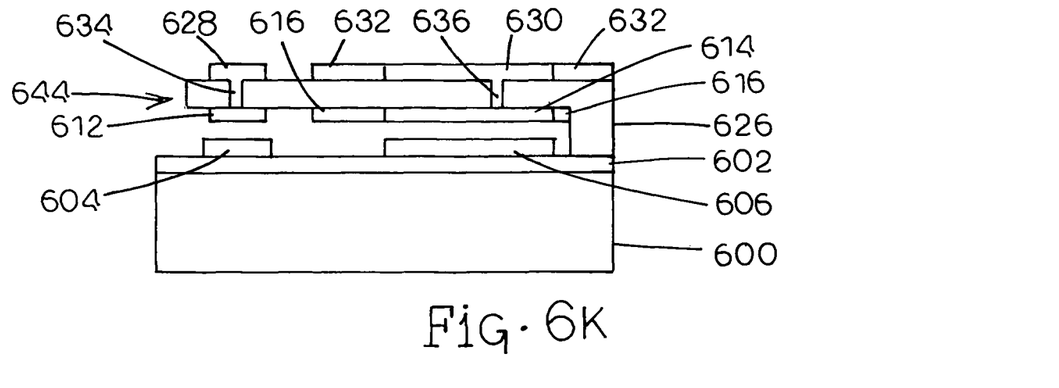

Referring to FIG. 6K, the final step in fabricating the MEMS switch is illustrated. In this step, sacrificial layer 610 is removed to form a trilayered beam, generally designated 644. Sacrificial layer 610 can be removed by any suitable method known to those of skill in the art.

It may be desired to have a MEMS switch that takes advantage of either the enhanced actuation or enhanced release. In that case, an alternate MEMS switch having either one of an actuation electrothermal component or a release electrothermal component can be fabricated and operated without the other component.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for implementing a switching function in a microscale device, comprising:
   (a) providing a stationary electrode and a stationary contact formed on a substrate;
   (b) providing a movable microcomponent suspended above the substrate and comprising:
      (i) a structural layer including at least one end fixed with respect to the substrate;
      (ii) a movable electrode spaced from the stationary electrode by a gap having a first distance, wherein the movable electrode is movable with respect to the stationary electrode when a voltage source is connected between the stationary electrode and the movable electrode;
      (iii) a movable contact spaced from the stationary contact, the movable contact being positioned farther from the at least one end than the movable electrode; and
      (iv) a first electrothermal component attached to the structural layer, the first electrothermal component being electrically isolated from the movable electrode and the stationary electrode and operable to produce heating when connected to a current source;
   (c) operating the voltage source to apply a voltage difference between the movable electrode and the stationary electrode to electrostatically couple the movable electrode with the stationary electrode, whereby electrostatically coupling the movable electrode with the stationary electrode deflects the movable component toward the substrate and moves the movable contact into contact with the stationary contact to permit an electrical signal to pass through the movable and stationary contacts; and
   (d) operating the current source to apply a current through the first electrothermal component to produce heating for generating force for facilitating movement of the microcomponent, wherein facilitating movement of the microcomponent comprises reducing the size of the gap to a second distance that is less than the first distance, and wherein operating the voltage source comprises applying a second voltage difference to deflect the movable component across the second distance, the second voltage difference being less than a first voltage difference required to deflect the movable component across the first distance.

2. The method according to claim 1, wherein the first electrothermal component is attached to a top side of the structural layer whereby the microcomponent moves in a direction toward the substrate when current is applied.

3. The method according to claim 2 further including removing the applied current, whereby the movable contact remains in contact with the stationary contact.

4. The method according to claim 1, wherein the first electrothermal component is attached to an underside of the structural layer whereby the microcomponent moves in a direction away from the substrate when current is applied.

5. The method according to claim 4 further including moving the movable contact from a position in contact with the stationary contact by removing the applied voltage and applying a current through the first electrothermal component, whereby heat is generated for deflecting the structural layer away from the substrate.

6. A method for implementing a switching function in a microscale device having a movable microcomponent, comprising:
   (a) operating a voltage source connected between a stationary electrode and a movable electrode of the microscale device to apply a voltage difference between the movable electrode and the stationary electrode for electrostatically coupling the movable electrode with the stationary electrode, wherein the stationary electrode and the movable electrode are separated by a gap having a first distance, whereby electrostatically coupling the movable electrode with the stationary electrode deflects the movable microcomponent and moves a movable contact into contact with a stationary contact to permit an electrical signal to pass through the movable and stationary contacts; and
   (b) operating a current source connected to a first electrothermal component of the microscale device to apply a current through the first electrothermal component to produce heating for generating force for facilitating movement of the microcomponent, wherein facilitating movement of the microcomponent comprises reducing the size of the gap to a second distance that is less than the first distance, wherein operating the voltage source comprises applying a second voltage difference to deflect the movable component across the second distance, the second voltage difference being less than a first voltage difference required to deflect the movable component across the first distance, the application of a current being independent from the application of a voltage difference.

7. The method according to claim 6, wherein the application of current to the first electrothermal component moves the movable contact into contact with the stationary contact.

8. The method according to claim 6, wherein the application of current to the first electrothermal component moves the movable contact in a direction away from the stationary contact.

9. The method according to claim 6 further including removing the applied current, wherein the applied voltage is sufficient to maintain the contact between the movable contact and the stationary contact.

10. The method according to claim 6 further including moving the movable contact from a position in contact with the stationary contact by removing the applied voltage and applying a current through the first electrothermal component, whereby heat is generated for deflecting the movable microcomponent away from the stationary contact.

11. The method according to claim 1, wherein the movable electrode is spaced directly above the stationary electrode.

12. The method according to claim 6, wherein the movable electrode is spaced directly above the stationary electrode.

* * * * *